(12) United States Patent
Houtepen et al.

(10) Patent No.: US 10,508,236 B2
(45) Date of Patent: Dec. 17, 2019

(54) WAVELENGTH CONVERTING MATERIAL FOR A LIGHT EMITTING DEVICE

(71) Applicant: Lumileds LLC, San Jose, CA (US)

(72) Inventors: Arjan-Jeroen Houtepen, San Jose, CA (US); Anne Wiebe Hoekstra, San Jose, CA (US); Francesca Pietra, San Jose, CA (US); Luca De Trizio, San Jose, CA (US); Liberato Manna, San Jose, CA (US)

(73) Assignee: LUMILEDS LLC, San Jose, CA (US)

( * ) Notice: Subject to any disclaimer, the term of this patent is extended or adjusted under 35 U.S.C. 154(b) by 0 days.

(21) Appl. No.: 15/771,315

(22) PCT Filed: Oct. 25, 2016

(86) PCT No.: PCT/US2016/058586
§ 371 (c)(1),
(2) Date: Apr. 26, 2018

(87) PCT Pub. No.: WO2017/074897
PCT Pub. Date: May 4, 2017

(65) Prior Publication Data
US 2018/0327664 A1    Nov. 15, 2018

Related U.S. Application Data

(60) Provisional application No. 62/247,086, filed on Oct. 27, 2015.

(51) Int. Cl.
*H01L 31/032* (2006.01)
*C09K 11/88* (2006.01)
*C09K 11/02* (2006.01)
*C09K 11/62* (2006.01)
*H01L 33/50* (2010.01)
(Continued)

(52) U.S. Cl.
CPC ............ *C09K 11/883* (2013.01); *C09K 11/02* (2013.01); *C09K 11/62* (2013.01); *C09K 11/623* (2013.01); *H01L 33/502* (2013.01); *H01L 33/505* (2013.01); *B82Y 30/00* (2013.01);
(Continued)

(58) Field of Classification Search
None
See application file for complete search history.

(56) References Cited

U.S. PATENT DOCUMENTS 7,288,468 B2    10/2007    Jang et al.
2010/0159248 A1    6/2010    Jang et al.
(Continued)

FOREIGN PATENT DOCUMENTS

WO    PCT/IB2013/058785    *  9/2013    ........... C09K 11/025

OTHER PUBLICATIONS

Youssef (Optical Properties of Zn-doped InP Single cystals (Physica A 235 (1997) 334-344).*
(Continued)

*Primary Examiner* — Ali Naraghi

(57) ABSTRACT

Embodiments of the invention include a luminescent structure including an $In_xZn_yP$ core, wherein $0<y/x<10$, and wherein the core comprises an alloy including both In and Zn, and a shell disposed on a surface of the core, wherein a difference between a lattice constant of the shell and a lattice constant of the core relative to the lattice constant of the shell is less than 1%.

18 Claims, 5 Drawing Sheets

(51) Int. Cl.
*B82Y 30/00* (2011.01)
*B82Y 40/00* (2011.01)

(52) U.S. Cl.
CPC ............. *B82Y 40/00* (2013.01); *H01L 33/507* (2013.01); *H01L 2933/0041* (2013.01)

(56) References Cited

U.S. PATENT DOCUMENTS

| | | | |
|---|---|---|---|
| 2010/0289003 A1 | 11/2010 | Kahen et al. | |
| 2011/0084250 A1 | 4/2011 | Jang et al. | |
| 2011/0126907 A1* | 6/2011 | Lee .................... | H01L 31/02167 136/261 |
| 2014/0117292 A1* | 5/2014 | Jun ..................... | H01L 31/0304 252/519.14 |
| 2014/0361228 A1 | 12/2014 | Jang et al. | |
| 2015/0284627 A1* | 10/2015 | Bohmer ............... | H01L 33/501 362/84 |

OTHER PUBLICATIONS

Thuy et al (Luminescence Properties of In (Zn)P alloy core/Zns shell quantum dots (Applied Physics Letters 97, 19304 (2010)).*
Kim et al (Large-Scale Synthesis of InznS Alloy Quantum Dots with Dodecanethiol as a Composition Controller, The journal of Physical Chemistry Letters, pp. 214-218).*
Katz, "Indium Phosphide and Related Materials: Processing, Technology and Devices," Artech House Inc. (1992).
Acharya et al., "Elucidation of Two Giants: Challenges to Thick-Shell Synthesis in CdSe/ZnSe and ZnSe/CdS Core/Shell Quantum Dots," J. Am. Chem. Soc. 150311144323005 (2015).
Alivisatos, "Perspectives on the Physical Chemistry of Semiconductor Nanocrystals," J. Phys. Chem., 100 (31), pp. 13226-13239 (1996).
Anderson et al., "Ligand exchange and the stoichiometry of metal chalcogenide nanocrystals: spectroscopic observation of facile metal-carboxylate displacement and binding," J Am Chem Soc., 135 (49):18536-48 (2013).
Bae et al., "Controlled alloying of the core-shell interface in CdSe/CdS quantum dots for suppression of Auger recombination," ACS Nano 7, 3411-9 (2013).
Baskoutas et al., "Size-dependent band gap of colloidal quantum dots," Journal of Applied Physics 99, 013708 (2006).
Beberwyck et al., "Cation Exchange: A Versatile Tool for Nanomaterials Synthesis," J. Phys. Chem. C, 117 (39), pp. 19759-19770 (2013).
Boldt et al., "Synthesis of Highly Luminescent and Photo-Stable, Graded Shell CdSe/CdxZn 1-x S Nanoparticles by in Situ Alloying," Chem. Mater. 25, 4731-4738 (2013).
Chen et al., "Compact high-quality CdSe-CdS core-shell nanocrystals with narrow emission line widths and suppressed blinking," Nat. Mater. 12, 445-51 (2013).
Christodoulou et al., "Synthesis of highly luminescent wurtzite CdSe/CdS giant-shell nanocrystals using a fast continuous injection route," J. Mater. Chem. C 2, 3439 (2014).
Cirillo et al., "'Flash' Synthesis of CdSe/CdS Core-Shell Quantum Dots," *Chem. Mater.* 26, 1154-1160 (2014).
Courtel et al., "Synthesis, Characterization, and Growth Mechanism of n-Type CuInS2 Colloidal Particles," Chem. Mater., 21 (16), pp. 3752-3762 (2009).
De Mello Donega, "Synthesis and properties of colloidal heteronanocrystals," Chem. Soc. Rev. 40, 1512-46 (2011).
De Trizio et al., "Strongly Fluorescent Quaternary Cu—In—Zn—S Nanocrystals Prepared from Cu 1-x InS 2 Nanocrystals by Partial Cation Exchange," Chem. Mater. 24, 2400-2406 (2012).
Dennis et al., "Suppressed blinking and auger recombination in near-infrared type-II InP/CdS nanocrystal quantum dots," Nano Lett. 12, 5545-51 (2012).
Denton et al., "Vegard's law," Phys. Rev. A 43, 3161 (Mar. 1, 1991).

Faur et al., "XPS investigation of anodic oxides grown on p-type InP," Article in Surface and Interface Analysis 15(11):641-650 (Nov. 1990).
Hoener et al., "Demonstration of a shell-core structure in layered cadmium selenide-zinc selenide small particles by x-ray photoelectron and Auger spectroscopies," The Journal of Physical Chemistry, 96 (9), 3812-3817 (1992).
Hollingsworth et al., "Heterostructuring Nanocrystal Quantum Dots Toward Intentional Suppression of Blinking and Auger Recombination," Chem. Mater. 25, 1318-1331 (2013).
Hossain et al., "Enhanced quantum confinement due to nonuniform composition in alloy quantum dots," Nanotechnology, 21(9):095401 (2010).
Kazmerski et al., "Comparison of low-temperature oxides on polycrystalline InP by AES, SIMS, and XPS," Journal of Vacuum Science and Technology 17, 1061 (1980).
Kim et al., "Design and synthesis of photostable multi-shell Cd-free nanocrystal quantum dots for LED applications," Journal of Materials Chemistry, Issue 40, 21370-21372 (2012).
Kim et al., "Highly Luminescent InP/GaP/ZnS Nanocrystals and Their Application to White Light-Emitting Diodes," Journal of the American Chemical Society, 134 (8), 3804-3809 (2012).
Kim et al., "Highly luminescing mufti-shell semiconductor nanocrystals InP/ZnSe/ZnS," *Appl. Phys. Lett.* 101, 073107 (2012).
Kim et al., "Large-Scale Synthesis of InPZnS Alloy Quantum Dots with Dodecanethiol as a Composition Controller," *J. Phys. Chem. Lett.* 3, 214-218 (2012).
Kim et al., "Reverse Type-I ZnSe/InP/ZnS Core/Shell/Shell Nanocrystals: Cadmium-Free Quantum Dots for Visible Luminescence," Small, vol. 7, Issue 1, 70-73 (2011).
Klimov et al., "Quantization of Multiparticle Auger Rates in Semiconductor Quantum Dots," Science, vol. 287, Issue 5455, pp. 1011-1013 (Feb. 2000).
Landolt-Börnstein, "Zinc phosphide (Zn3P2) optical properties, dielectric constant," Part of the Landolt-Börnstein—Group III Condensed Matter book series (vol. 41C), Non-Tetrahedrally Bonded Elements and Binary Compounds I pp. 1-16 (1998).
Li et al., "One-pot synthesis of highly luminescent InP/ZnS nanocrystal$ without precursor Injection," *J. Am. Chem. Soc.* 130, 11588-9 (2008).
Lim et al., "Highly efficient cadmium-free quantum dot light-emitting diodes enabled by the direct formation of excitons within InP@ZnSeS quantum dots," *ACS Nano* 7, 9019-26 (2013).
Lim et al., "InP@ZnSeS, Core@ Composition Gradient Shell Quantum Dots with Enhanced Stability," *Chem. Mater.* 23, 4459-4463 (2011).
Mashford et al., "High-efficiency quantum-dot light-emitting devices with enhanced charge Injection," *Nat. Photonics* 7, 407-412 (2013).
McKittrick et al., "Review: Down Conversion Materials for Solid-State lighting," J. Am. Ceram. Soc:. 97, 1327-1352 (2014).
Misiewicz et al., "Zn3P2: new material for optoelectronic devices", Proc. SPIE 1561, Inorganic Crystals for Optics, Electro-Optics, and Frequency Conversion, (Dec. 1, 1991).
Misiewicz et al., "Lattice modes of Zn3P2," Solid State Communications, vol. 66, Issue 7, pp. 747-750 (1988).
Mushonga et al., "Indium Phosphide-Based Semiconductor Nanocrystals and Their Applications," J. Nanomater. 2012, 1-11 (2012).
Mutlugun et al., "Large-area (over SO cmx50 cm) freestanding films of colloidal InP/ZnS quantum dots," *Nano Lett.* 12, 3986-93 (2012).
Nag et al., "Metal-free Inorganic Ligands for Colloidal Nanocrystals: S2-, HS-, Se2-, HSe-, Te2-, HTe-, TeS32-, OH-, and NH2— as Surface Ligands," Journal of the American Chemical Society, 133 (27), 10612-10620 (2011).
Nelson et al., "An experimental investigation of extrapolation methods in the derivation of accurate unit-cell dimensions of crystals," Proceedings of the Physical Society, vol. 57, No. 3, 160-177 (1945).
NIST X-ray Photoelectron Spectroscopy Database, Version 4.1 National Institute of Standards and Technology, Gaithersburg, https://srdata.nist.gov/xps/, Available at: https://web.archive.org/web/20151026173301/https://srdata.nist.gov/xps/ (Oct. 26, 2015).

(56) References Cited

OTHER PUBLICATIONS

Owen, "Nanocrystal structure. The coordination chemistry of nanocrystal surfaces," Science, 347(6222):615-6 (2015).

Peng et al., "Epitaxial Growth of Highly Luminescent CdSe/CdS Core/Shell Nanocrystals with Photostability and Electronic Accessibility," 1. Am. Chem. Sac. 119, 7019-7029 (1997).

Pietra et al., "Tuning the Lattice Parameter of InxZnyP for Highly Luminescent Lattice-Matched Core/Shell Quantum Dots," ACS Nano 10 (4), 4754-4762 (2016).

Protiere et al., "Highly luminescent Cd1-xZnxSe/ZnS core/shell nanocrystals emitting in the blue-green spectral range," *Small* 13, 399-403 (2007).

Reiss et al., "Core/Shell semiconductor nanocrystals," Small 15, 154-68 (2009).

Roduner, "Size matters: why nanomaterials are different," Chem Soc Rev. Jul;35(7):583-92 (2006).

Ryu et al., "Step-Wise Synthesis of InP/ZnS Core-Shell Quantum Dots and the Role of Zinc Acetate," Chemistry of Materials, 573-575 (2009).

Sadekar et al., "Bandgap engineering by substitution of S by Se in nanostructured ZnS1—xSex thin films grown by soft chemical route for nontoxic optoelectronic device applications," Journal of Alloys and Compounds. 509. 5525-5531 (2011).

Shin et al., "Photoluminescence decay measurements of $ZnS_xSei_{1-x}$ (0<x <0.12) epilayers on GaAs substrate grown by molecular beam epitaxy," Solid State Communications, vol. 102, Issue 12, pp. 855-859 (Jun. 1997).

Soenen et al., "Cytotoxicity of cadmium-free quantum dots and their use in cell bioimaging," Chemical Research in Toxicology, 27(6):1050-1059 (2014).

Song et al., "Amine-derived synthetic approach to color-tunable InP/ZnS quantum dots with high fluorescent qualities," Journal of Nanoparticle Research, 15(6), 1750 (Jun. 2013).

Talapin et al., "CdSe/CdS/ZnS and CdSe/ZnSe/ZnS Core-Shell-Shell Nanocrystals," J. Phys. Chem. B 108, 18826-18831 (2004).

Thuy et al., "Luminescence properties of In(Zn)P alloy core/ZnS shell quantum dots," Applied Physics Letters. (2010).

Wei et al., "Colloidal semiconductor quantum dots with tunable surface composition," Nano Lett., 12(9):4465-71 (2012).

Xi et al., "Understanding the Role of Single Molecular ZnS Precursors in the Synthesis of In(Zn)P/ZnS Nanocrystals," ACS Appl. Mater. Interfaces, 6 (20), pp. 18233-18242 (2014).

Xie et al. "Colloidal InP nanocrystals as efficient emitters covering b[ue to near-infrared," *J. Am. Chem. Soc.* 129, 15432-3 (2007).

Xu et al., "Rapid synthesis of highly luminescent InP and InP/ZnS nanocrystals," J. Mater. Chem. 18, 2653 (2008).

Yang et al., "Full visible range covering InP/ZnS nanocrystals with high photometric performance and their application to white quantum dot light-emitting diodes," Adv. Matter. 24, 4180-5 (2012).

Zanin et al., "Structure of $Zn_3P_2$," Journal of Structural Chemistry, vol. 45, Issue 5, pp. 844-848 (2004).

Zhang et al., "Facile synthesis of ZnS—CuInS2-alloyed nanocrystals for a color-tunable fluorchrome and photocatalyst," *Inorg. Chem.* 5O, 4065-72 (2011).

Zhang et al., "Fluorescent nanomaterial-derived white light-emitting diodes: what's going on," J. Mater. Chem. C 2, 4358 (2014).

\* cited by examiner

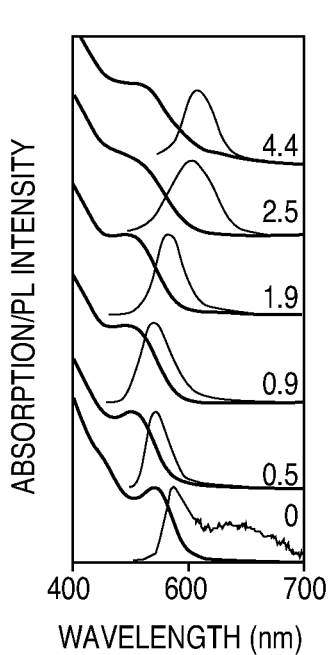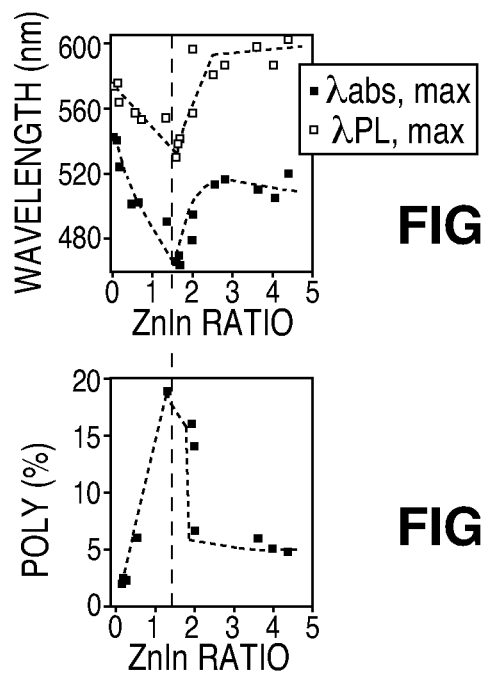
FIG. 9A
FIG. 9B
FIG. 9C
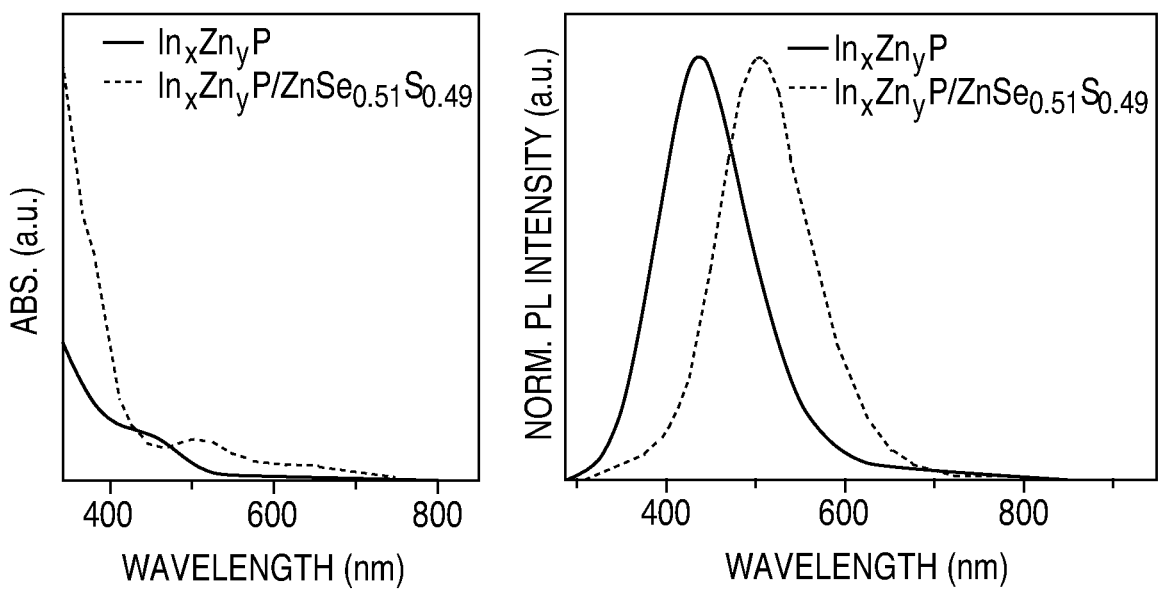
FIG. 10

WAVELENGTH CONVERTING MATERIAL FOR A LIGHT EMITTING DEVICE

CROSS-REFERENCE TO RELATED APPLICATIONS

The present application claims priority to U.S. Provisional Patent Application No. 62/247,086, filed Oct. 27, 2015. U.S. Provisional Patent Application No. 62/247,086 is incorporated herein.

BACKGROUND

Semiconductor light-emitting devices including light emitting diodes (LEDs), resonant cavity light emitting diodes (RCLEDs), vertical cavity laser diodes (VCSELs), and edge emitting lasers are among the most efficient light sources currently available. Materials systems currently of interest in the manufacture of high-brightness light emitting devices capable of operation across the visible spectrum include Group III-V semiconductors, particularly binary, ternary, and quaternary alloys of gallium, aluminum, indium, and nitrogen, also referred to as III-nitride materials. Typically, III-nitride light emitting devices are fabricated by epitaxially growing a stack of semiconductor layers of different compositions and dopant concentrations on a sapphire, silicon carbide, III-nitride, or other suitable substrate by metal-organic chemical vapor deposition (MOCVD), molecular beam epitaxy (MBE), or other epitaxial techniques. The stack often includes one or more n-type layers doped with, for example, Si, formed over the substrate, one or more light emitting layers in an active region formed over the n-type layer or layers, and one or more p-type layers doped with, for example, Mg, formed over the active region. Electrical contacts are formed on the n- and p-type regions.

A light emitting device such as an LED is often combined with a wavelength converting material. Colloidal semiconductor nanocrystals (NCs), also called quantum dots (QDs), have attracted considerable interest in several fields (renewable energy, optoelectronic and biomedical devices) due to their unique optical and electrical properties. In particular, QDs are seen as suitable candidates to replace current phosphors in LEDs, especially red phosphors, for general lighting as they may enhance the overall LED efficiency, due to their narrow-band emission, and may produce high quality white light.

BRIEF DESCRIPTION OF THE DRAWINGS

FIG. 9A illustrates normalized absorption and normalized PL spectra of $In_xZn_yP$ QDs with different $Zn^{2+}$ concentration. FIG. 9B is a plot of the $\lambda$,max (nm) for the absorption and PL emission wavelengths as function of the Zn/In molar ratio obtained by ICP(OES) analysis. FIG. 9C is a plot of the PL QY (%) of $In_xZn_yP$ QDs as function of the Zn/In molar ratio obtained by ICP(OES) analysis.

FIG. 10 is a plot of absorption (left) and PL emission (right) of an $In_xZn_yP$ core with Zn/In:2.8 and an $In_xZn_yP$/$ZnSe_{0.51}S_{0.49}$ core-shell.

DETAILED DESCRIPTION

Figure 1:
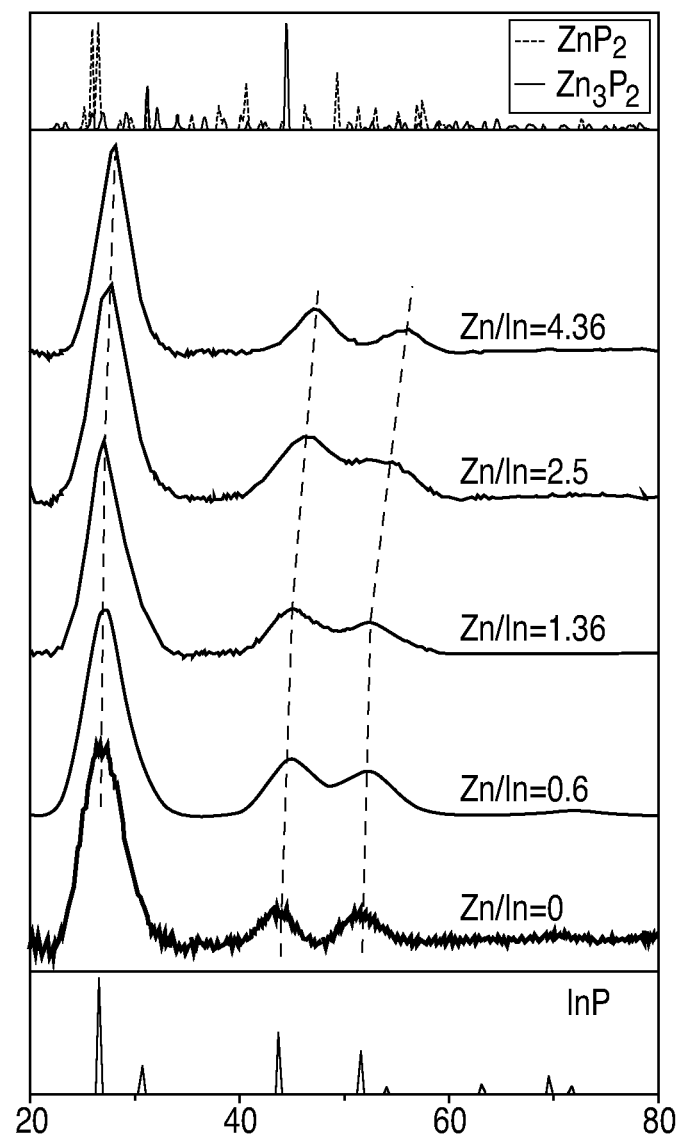
FIG. 1 illustrates X-ray diffraction (XRD) patterns of zinc blende $In_xZn_yP$ NCs, with different $Zn^{2+}$ concentrations.

The main requirements for QDs to be employed in commercial applications are a high photoluminescence (PL) quantum efficiency (QE), and a high stability. Among investigated materials, cadmium-based QDs, such as, for example CdSe, represent the current state-of-the-art, and have been well studied for such applications. However, Cd based QDs are undesirable due to their high toxicity. InP based QDs are recognized a promising Cd-free material, since they can offer a comparable emission range to that of Cd-based QDs. However, their full potential has not yet been demonstrated as their quality (QE and stability) lags behind that of Cd based QDs. One strategy for achieving higher PL efficiency is to epitaxially grow a shell of a wider band gap material around the QD core, resulting in core/shell particles. In this manner, the PL efficiency and stability against photo-oxidation can be significantly improved. Note that the shell material must be carefully chosen so that its properties (such as band-gap) are compatible with the intended application.

One of the main problems associated with epitaxial growth of a shell layer onto a QD core is the lattice mismatch between the core and shell materials, which can lead to the formation of defects at the interface. These defects can act as trap states for photogenerated charge carriers, leading to non-radiative decay and hence reduction of the PL QE. Most of the approaches developed to reduce or eliminate defect formation during the shell growth have dealt with optimizing the shell structure.

One approach is the use of multiple shells around the emissive core, CdSe/CdS/ZnS being a typical example. The outer shell is often a high band-gap material to confine the exciton, while the inner shell is designed to address the lattice mismatch between the core and the outer shell. Another approach involves gradient alloying of the inner shell and the outer shell during the shell growth, to reduce the strain due to lattice mismatch between the inner and outer shell.

For example, in the case of CdSe/CdS or CdSe/ZnS, a gradient shell may be formed by simultaneous addition of Se and S precursors in the case of CdSe/CdS, or Zn and Cd precursors in the case of CdSe/ZnS. A similar approach for the synthesis of $Cd_xZn_{1-x}S$ graded shells on CdSe nanoparticles is based on interface alloying between CdS and ZnS shells by performing the reaction at elevated temperatures (300° C.). An intermediate layer, such as ZnSe, may serve as a "lattice adapter" (or buffer layer) to ensure a low lattice strain. Examples of QDs with an intermediate layer include CdSe/ZnSe/ZnS and InP/GaP/ZnS.

However, these strategies increased the complexity of fabrication of core/shell QDs. Also, although they sometimes reduced the lattice mismatch in the layered structure and hence resulted in fewer interfacial defects, this approach aimed to reduce strain in the shell structure. The lattice mismatch between the emissive core and the first shell is therefore not eliminated in this approach, hence it is likely that some interfacial defects remain near the core, where they may be most harmful to the performance of the QDs. In addition, the formation of low lattice mismatch core-shell systems based on InP QDs has been less successful than for Cd-based systems, which is likely a significant reason why the QE and stability of InP-based QDs has historically been lower than for Cd-based QDs.

In embodiments of the invention, the core of a core-shell QD has a crystal lattice constant that matches or nearly matches the lattice of a shell structure, thereby reducing the problem of lattice mismatch between the core and the shell, potentially reducing or eliminating defects in the core/shell QDs, while retaining the confinement of the excitons. In some embodiments, the lattice constant of a QD is altered by replacing an atom in the QD with a smaller atom. In some embodiments, the replaced atom is a cation that is replaced with a cation having a smaller ionic radius. In some embodiments, the lattice constant of InP-based QDs is altered by replacing some $In^{3+}$ atoms inside the nanocrystals with a cation having a smaller ionic radius, such as, for example, $Zn^{2+}$. The second cation is introduced during the synthesis of InP QDs. The $Zn^{2+}$ cation incorporates into the crystal of the QDs at the $In^{3+}$ site in some embodiments, or in any other suitable location that forms an alloy including both $In^{3+}$ and $Zn^{2+}$.

In some embodiments, the lattice constant of the InP-based alloyed QDs may be selected to match a wide range of shell materials including, for example, ZnSe, GaP, and ZnS. This allows the formation of fully lattice matched core-shell and core-shell-shell QDs. This approach can be used to synthesize fully lattice matched or nearly lattice matched cadmium free $In_xZn_yP/GaP/ZnSe_zS_{1-z}$ QDs, where x/y=0-10 and z=0-1. In some embodiments, the core-shell QDs are entirely zinc blende crystal structures (i.e., both the core and shell are zinc blende materials), with the lattice constant of GaP. Alternatively, in some embodiments, the lattice constant of an InP-based core may be matched or nearly matched to that of a $ZnSe_zS_{1-z}$ shell, without an intermediate GaP shell. This provides an alternative to including an intermediate GaP shell as buffer layer to accommodate the lattice mismatch between core and outer shell. Such lattice tuned $In_xZn_yP/ZnSe_zS_{1-z}$ QDs may exhibit PL QYs as high as $In_xZn_yP/GaP/ZnSe_zS_{1-z}$ QDs.

In some embodiments, by gradually increasing the concentration of $Zn^{2+}$ in $In_xZn_yP$ QDs, the crystal lattice may shrink, while beneficially preserving the zinc-blende crystal structure of pure InP. $Zn^{2+}$ is incorporated into the NCs during the synthesis as a substitutional dopant onto $In^{3+}$ sites. The ionic radius of $Zn^{2+}$ is 0.074 nm and the ionic radius of $In^{3+}$ is 0.081 nm, therefore the cation replacement of $In^{3+}$ by $Zn^{2+}$ leads to the lattice shrinking. Even when $Zn^{2+}$ is used in a high excess in the synthesis, no side formation of secondary phases was observed except for the desired $In_xZn_yP$ phase.

FIG. 1 demonstrates that as the $Zn^{2+}$ concentration increases, the crystal lattice shrinks, but the structure remains zinc-blende. FIG. 1 illustrates X-ray diffraction (XRD) patterns of zinc blende $In_xZn_yP$ NCs, with different $Zn^{2+}$ concentrations. The XRD pattern of bulk zinc blende InP is shown in the lower panel, and the XRD patterns of tetragonal $Zn_2P$ and monoclinic $Zn_3P_2$ are shown in the upper panel. The Zn/In ratios shown were determined by inductively coupled plasma atomic emission spectroscopy (ICP-AES) analysis. The samples prepared with addition of Zn precursor exhibit similar XRD reflections but with a systematic shift towards higher diffraction angles as the concentration of Zn is increased. This demonstrates that all samples have a zinc-blende crystal structure and that the addition of Zn produced a systematic contraction of the final crystal lattice rather than producing other side products, such as $Zn_xP_y$ NCs (i.e. tetragonal or monoclinic $Zn_2P$, or monoclinic or cubic $Zn_3P_2$) that would exhibit clear distinguishable XRD peaks. The data illustrated in FIG. 1 excludes a scenario whereby Zn only goes on the surface of the NC, such as a dopant species, since such a scenario would not lead to a shift in the XRD patterns.

To confirm that Zn substitutes for In, simulated XRD patterns were compared to experimental XRD patterns. In the case of substitutional zinc, $Zn^{2+}$ cations were progressively introduced in the composition of the QD while preserving charge neutrality. To preserve charge neutrality, $In^{3+}$ cations were substituted by $Zn^{2+}$ cations and one $P^{3-}$ anion was removed from the structure. In the case of interstitial zinc, two $Zn^{2+}$ were introduced on $In^{3+}$ sites while a third $Zn^{2+}$ cation was placed in an interstitial position. Simulated XRD patterns of the Zn on substitutional sites show a shift at higher 2 theta that closely resemble the experimental XRD patterns while the simulated XRD patterns of the Zn on interstitial sites deviate significantly from the experimental results. Therefore, the results in FIG. 1 suggest that Zn is incorporated substitutionally on In sites. The contraction of the lattice upon incorporation of Zn, may be explained by the smaller atomic number of Zn compared to In.

Regarding the actual charge of $In_xZn_yP$ NCs, as described above, indium cations are replaced with zinc cations, having stable oxidation states of 3+ and 2+, respectively. In order to study if this substitution had any influence in the final charge of the $In_xZn_yP$ NCs, the ζ-potential of the NCs obtained using a Zn/In ratio of 0, 1, and 2 was measured. Within the experimental error, the measured charge was zero for all samples. Accordingly, any charge introduced by the substitutional $Zn^{2+}$ is somehow compensated. Four charge compensating scenarios are contemplated: (i) p-doping could occur to compensate for the net negative charge introduced by $Zn^{2+}$ on and $In^{3+}$ site. However, this would most likely lead to efficient Auger quenching and absorption bleach, of which no indications are found in the UV-VIS absorption and emission measurements. (ii) $Zn^{2+}$ could occupy both interstitial and substitutional positions in the NC, in this case for three $Zn^{2+}$ incorporated into the NCs only two $In^{3+}$ sites would be occupied, preserving neutrality. The comparison between experimental and simulated XRD patterns presented above shows that this is likely not the case. (iii) The InP QDs are passivated by negatively charged x-type palmitate ligands. If the QDs become negatively charged due to $Zn^{2+}$ on $In^{3+}$ sites, it seems likely that this could induce the desorption of such ligands which would lead to charge balance. There is no evidence for or against this scenario. (iv) Phosphorus vacancies may form to balance the charge (one for every three $In^{3+}$ replaced by three $Zn^{2+}$).

There are at least two possible mechanisms for the formation of the alloy including In and Zn: (i) after the nucleation and growth of InP NCs, $In^{3+}$ is replaced by $Zn^{2+}$ via a cation exchange reaction; or (ii) $In^{3+}$ and $Zn^{2+}$ react simultaneously with $P^{3-}$ directly forming alloyed $In_xZn_yP$ NCs. A kinetic study of the synthesis was carried out by monitoring the Zn/In ratio at different stages of the reaction via ICP(AES) (between 30 s and 2 h) for $In_xZn_yP$ where initial concentrations of Zn/In=1.5 and Zn/In=4 were used. The observed Zn/In ratio was roughly constant during the whole reaction, showing a slight variation from 1.45 to 1.80 in the case of Zn/In=⅕, and from 3.56 to 3.73 in the case of Zn/In=4. This suggests that $Zn^{2+}$ ions are incorporated into the NC from the very early stages of the reaction, leading to the formation of $In_xZn_yP$ alloyed NCs. Had the $Zn^{2+}$ instead exchanged the $In^{3+}$ in preformed InP NCs, a significant increase in $Zn^{2+}$ content at a certain stage during the reaction would have been observed, i.e. scenario (ii). In addition, the spectral position of the first absorption peak, which is intrinsically correlated to the size of the QDs, kept changing during the entire reaction time, showing that the NCs continued to grow.

Figure 2:
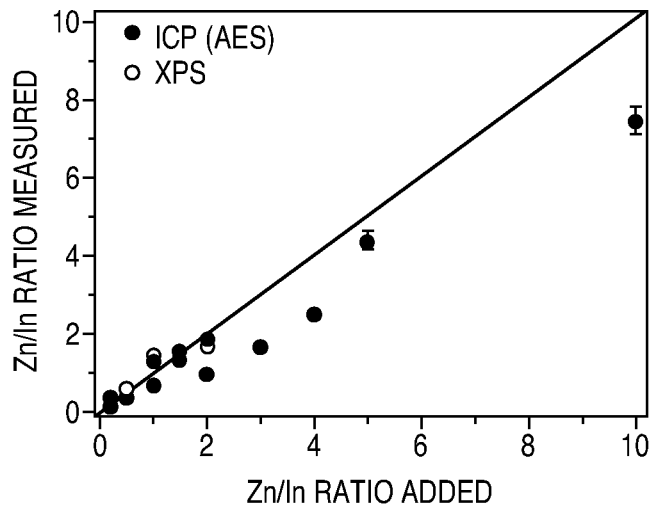
FIG. 2 illustrates the Zn/In ratio measured via ICP-AES elemental analysis and X-ray photoelectron spectroscopy (XPS) as a function of the amount of $Zn^{2+}$ added in the reaction.

FIG. 2 demonstrates that an InZnP alloy is formed, rather than simply InP particles doped with Zn. FIG. 2 plots the Zn/In ratio measured via ICP-AES elemental analysis and X-ray photoelectron spectroscopy (XPS) as a function of the amount of $Zn^{2+}$ added in the reaction. To ensure that all the side products of the reaction were removed and that the species detected were only in the QDs, the particles were washed three times with ethanol. As an additional washing step the organic ligands were stripped and replaced with an inorganic ligand($S^{2-}$). Therefore the ratio measured refers only to that present in the QDs. Up to Zn/In=2 the points follow a linear trend, whereas in the range Zn/In=2-10 a sub linear trend can be observed. However, even in the case of Zn/In=10, a ratio of Zn/In=7.4 is measured in the QDs. This indicates that the particles are not merely InP doped with Zn, but rather that a true alloy is formed. Accordingly, the composition of the particles, and therefore the lattice spacing, may be strictly controlled. In some embodiments, during synthesis, up to a Zn/In ratio of 2 there is a one-to-one correspondence between the determined ratio and the precursor ratio of In/Zn provided during synthesis. This indicates that the Zn precursors are quantitatively incorporated into the NCs. Increasing the amount of Zn/In precursor ratio above 2 results in experimental Zn/In ratios slightly below the added ratio. In some experiments, the curve reached saturation at Zn/In ratio of ~4, as a plateau could be observed. Accordingly, even when using high Zn/In ratio (Zn/In:10 or 20), no more than ~Zn/In:4 is incorporated into the NCs in some embodiments. In some embodiments, the Zn/In ratio is therefore in the range 0-5.

Figure 3:
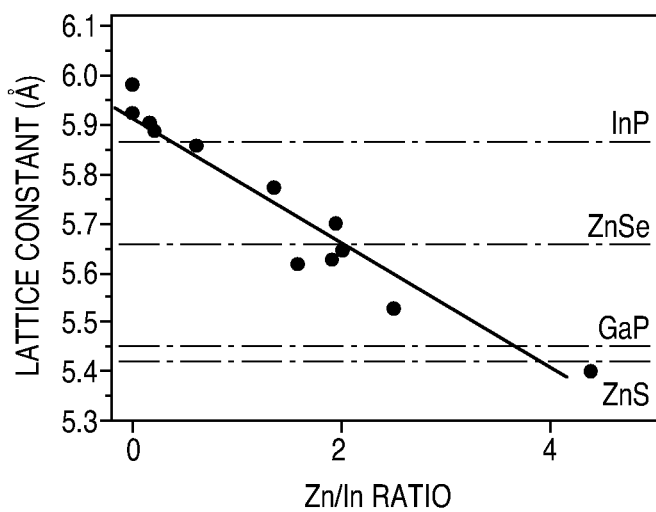
FIG. 3 illustrates lattice constant of $In_xZn_yP$ nanocrystals as a function of the $Zn^{2+}$ concentration.

The technique described above permits tuning of the lattice constant between 5.927 nm, in the case of pure InP, to 5.542 nm in the case of $InZn_5P_z$, as illustrated in FIG. 3. FIG. 3 is plot of lattice constant of $In_xZn_yP$ NCs as a function of the $Zn^{2+}$ concentration. The dashed lines indicate the lattice constant for bulk InP, ZnSe, GaP, and ZnS. The lattice constants of $In_xZn_yP$ were calculated using a Nelson-Riley plot. It is clear from FIG. 3 that by addition of a second cation, the core's lattice constant may be selected such that it matches the lattice constant of a given shell structure. Thus, $In_xZn_yP$ cores can be fabricated with lattice spacing comparable to the lattice spacing of shell materials such as ZnSe, GaP and ZnS. Consequently, it may be possible to design core/shell QDs without a lattice mismatch between the lattices of the core and shell, or with reduced lattice mismatch as compared to the prior art. This allows epitaxial growth of the shells potentially without the formation of interfacial defects, which may improve PL QE and PL stability. The lattice constant of the core may be at least 5.4 Å in some embodiments, at least 5.405 Å in some embodiments, no more than 6 Å in some embodiments, no more than 5.927 Å in some embodiments, at least 5.542 Å in some embodiments, and no more than 5.833 Å in some embodiments.

The addition of Zn may improve the PL QY, up to 20% in some embodiments. PL emission spectra show that the addition of zinc precursor has a clear influence on the removal of trap states of the resulting NCs. The PL emission spectrum of the pure InP QDs shows a broad secondary peak at lower energies, a peak usually associated with defect trap states. Upon the introduction of zinc this peak is suppressed. At the same time PL QY of the alloyed QDs increases from about 0-1% in pure InP up to 20% in for Zn/In=1.5. Also, the PL decay becomes longer as the amount of zinc increases, showing that the addition of Zn decreases the rate of non-radiative recombination. That the addition of zinc leads to an enhancement of the PL QY might suggest that the $Zn^{2+}$ ions, in addition to being incorporated inside the QD lattice, can also passivate the surface of the NCs as it is known that usually the trap states in QDs are mainly located on the surface. In some embodiments, the PL QY is highest when the lattices of core and shell are matched to each other. A maximum PL QY of 64% was observed for $In_xZn_yP/ZnSe_zS_{1-z}$ with y/x=2 and z=0.8.

Several groups have used $Zn^{2+}$ in the synthesis of InP quantum dots, for example to attempt to improve the PL efficiency of the core, or to assist the shell growth. However, there is no evidence in this earlier work that $Zn^{2+}$ was included in the crystal lattice of the InP QDs, rather than simply present as a dopant. In addition, the earlier work did not teach using $Zn^{2+}$ as a tool to tune the lattice constant of the resulting NCs.

Increasing the concentration of $Zn^{2+}$ in InP QDs may shift the PL emission to lower wavelengths. In some embodiments, the lattice-matching cores synthesized with the above-described method may emit in the green-yellow region of the spectra. In some embodiments, the synthesis method described above may be adapted to grow bigger $In_xZn_yP$ QDs that can emit at higher wavelengths, for example by subsequent addition of In+Zn precursors.

In some embodiments, the InZnP core-shell materials described herein are used with an intermediate GaP layer between the $In_xZn_yP$ core and the $ZnSe_zS_{1-z}$ shell, hence forming $In_xZn_yP/GaP/ZnSe_zS_{1-z}$ QDs or $In_xZn_yP/InGaP/GaP/ZnSe_zS_{1-z}$ QDs.

One or more intermediate Ga-containing layers may be formed by adding a $Ga^{3+}$ precursor such as $Ga(OA)_3$ to the reaction mixture of as synthesized $In_xZn_yP$ QDs. When a small amount of Ga precursor (less than 0.12 mmol) is added to zinc-containing indium phosphide QDs, in some embodiments a cation exchange reaction occurs, whereby zinc ions are gradually replaced by gallium ions starting from the surface, and, thus, forming $In_xZn_yP/In$—Ga—P core/graded-shell heterostructures. As the In—Ga—P shell forms at the expenses of the starting $In_xZn_yP$ NCs, a blue-shift of the exciton absorption peak (i.e. GaP has a wider bandgap in respect to InP) takes place. The In—Ga—P graded shell may passivate the surface of the starting QDs, and/or may allow for an unstrained matching between the core and shell materials (the lattice mismatch between InP and GaP is 6.9%), thus reducing the defect density at the interface, and, consequently, increasing the PL QY. When a large amount of Ga precursor is added (more than 0.09-0.12 mmol), the cation exchange between $Zn^{2+}$ and $Ga^{3+}$ ions goes to completion and extra gallium deposits on the surface of the QDs, causing an increase in the QDs size, and therefore a red-shift and a decrease in the PL QY.

In some embodiments, the addition of a Ga precursor may increase particle size, for example from 2.8±0.3 nm in case of $In_xZn_yP$ (Zn/In=1.5) cores to 3.5±0.3 nm for $In_xZn_yP/$In—Ga—P QDs (after the addition of 0.15 mmol of $Ga(OA)_3$). When little or no zinc is present in the starting NCs, the Ga directly deposits on the surface of the QDs, generating defects at the interface and potentially impeding any improvement of the PL QY. In some embodiments, a Ga-containing intermediate layer is used with $In_xZn_yP$ cores where Zn/In≥0.5.

The inventors observed an increase in PL QY upon addition of Ga, which is strongly dependent on the Zn concentration in starting $In_xZn_yP$ nanocrystals. The best PL QY (40%) was achieved when synthesizing starting indium phosphide QDs using a Zn/In ratio of 1.5 and adding, afterward, 0.09 mmol of $Ga(OA)_3$. To further enhance the PL emission of such QDs a thicker GaP shell was grown. In order to overgrow a GaP shell subsequent amounts of gallium $(Ga(OA)_3)$ and phosphorus $(P(TMS)_3)$ precursors were injected into the crude reaction mixture containing the as synthesized $In_xZn_yP/$In—Ga—P QDs. A maximum PL QY of 55% was reached after one addition of Ga and P precursors while further growth of the GaP shell resulted in a broadening of the PL spectra and in a decrease of the PL QY. As the GaP shell becomes thicker, the lattice mismatch between the core and the shell becomes more important leading to an increase of the lattice strain at the interface and possibly to a higher defect density, hence causing a reduction of the PL QY.

To improve the PL emission and the photo-stability, a further shell of a wider band gap material was overgrown onto the $In_xZn_yP/$In—Ga—P/GaP QDs. Following the principle of minimizing the lattice mismatch between the core and the shell materials, $ZnSe_zS_{1-z}$ alloy is used as the shell material, for which the lattice constant can be tuned according to the Se/S ratio. The $ZnSe_zS_{1-z}$ shell growth procedure involved the addition of a $(TOP-Se)_z$ and $(TOP-S)_{1-z}$ mixture together with zinc-stearate to the crude reaction mixture of $In_xZn_yP/$In—Ga—P/GaP QDs. The relative amount of Se and S (z) was chosen so that the lattice constant of the shell would match or nearly match, as described above, the lattice constant of the $In_xZn_yP/$In—Ga—P/GaP QDs.

Figure 11A:
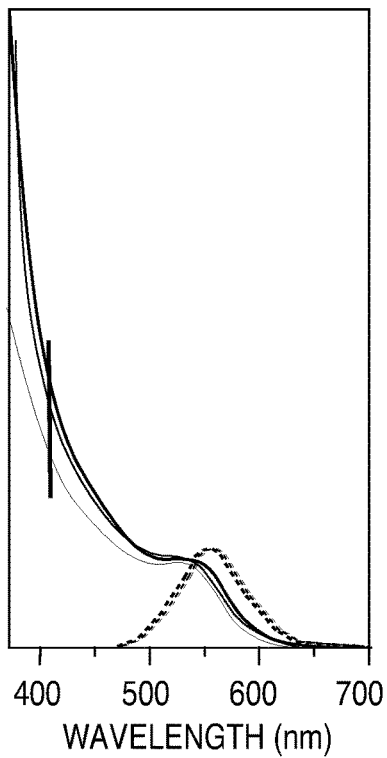
FIG. 11A illustrates absorption (solid line) and emission (dashed line) spectra of $In_xZn_yP$/In—Ga—P/GaP/$ZnSe_zS_{1-z}$ core/shell QDs at different stages during the growth of a $ZnSe_zS_{1-z}$ shell.
Figure 11B:
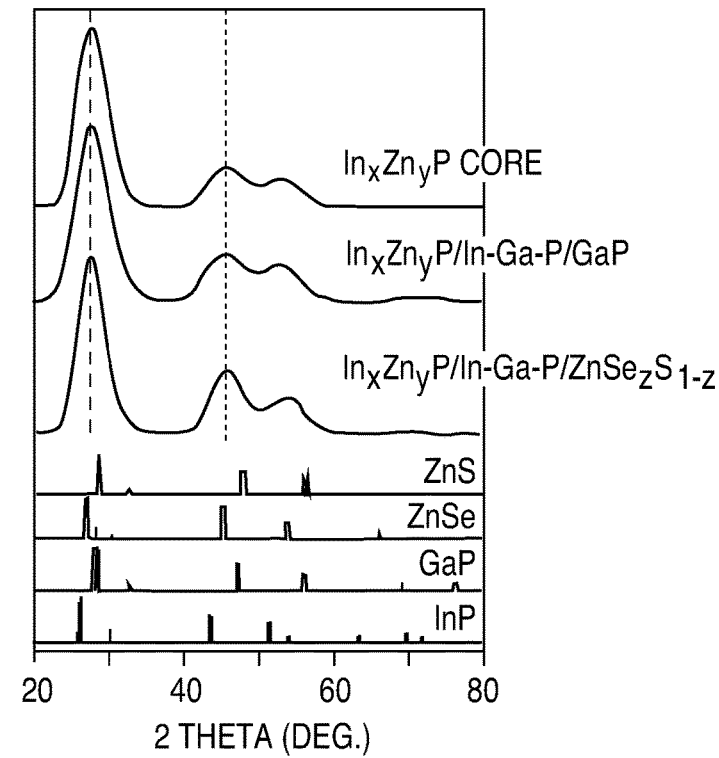
FIG. 11B illustrates XRD patterns obtained from drop-cast solutions of $In_xZn_yP$ (Zn/In=1.5) QDs, $In_xZn_yP$/In—Ga—P/GaP QDs, and $In_xZn_yP$/GaP/$ZnSe_zS_{1-z}$ QDs. The corresponding bulk reflections of zinc blende InP, GaP, ZnSe, ZnS, are reported in the lower panels.
Figure 11C:
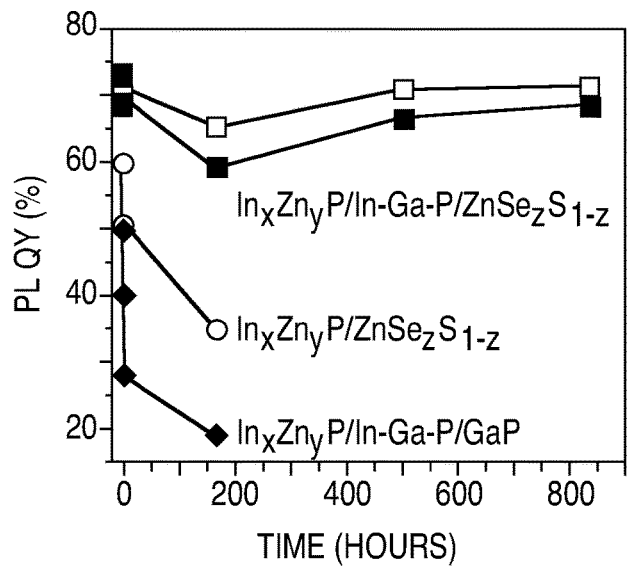
FIG. 11C illustrates photoluminescence quantum yield for four suspensions of QDs kept under constant UV irradiation (UV lamp (1 W/cm²)), as a function of the irradiation time. Four samples were measured: two batches of purified $In_xZn_yP$/In—Ga—P/GaP/$ZnSe_xS_{1-x}$ QDs, $In_xZn_yP$/$ZnSe_xS_{1-x}$ QDs, and $In_xZn_yP$/In—Ga—P/GaP QDs.

FIG. 11A shows the absorption and emission spectra of $In_xZn_yP/$In—Ga—P/GaP/$ZnSe_zS_{1-z}$ core/multiple-shells QDs at different shell reaction times. Upon the shell growth a marked increase of the absorbance at wavelengths below 440 nm, corresponding to the band gap of bulk $ZnSe_zS_{1-z}$, was observed, proving the overgrowth of the expected zinc sulphide selenide material. FIG. 11B shows the XRD patterns observed for $In_xZn_yP$ QDs, $In_xZn_yP/$In—Ga—P/GaP QDs, and $In_xZn_yP/$In—Ga—P/GaP/$ZnSe_zS_{1-z}$ QDs, which confirm not only that the three samples have a zinc blende crystal structure, but also that a lattice matched core/shell structures were formed, as no shift of XRD peaks was observed. TEM analysis further supported the formation of a $ZnSe_zS_{1-z}$ shell as, after the shell growth procedure nearly spherical QDs with a diameter of 4.6±0.6 nm were observed, indicating that a 0.6 nm shell has been grown. A thicker shell (1 nm), could also be grown via a multiple injection approach.

The resulting QDs were characterized by a PL emission peaked at 565 nm with a full width at half maximum of 52 nm and a PL QY of up to 75%. Core/Shell QDs emitting at longer wavelength (620 nm) were also synthesized by using $In_xZn_yP$ cores emitting at λ>600 nm.

Reliability tests were performed on InP base core/shell without the GaP shell or the $ZnSe_zS_{1-z}$ shell respectively. The results are summarized in 11C. A dispersion of purified $In_xZn_yP/$In—Ga—P/GaP QDs, $In_xZn_yP/ZnSe_zS_{1-z}$ QDs and $In_xZn_yP/$In—Ga—P/GaP/$ZnSe_zS_{1-z}$ QDs in toluene were loaded, under ambient conditions, into a capillary, placed on the top of a GaN LED (lamp power 1 $W/cm^2$; Temperature 50-60° C.) and the PL QY was monitored for 5 weeks. In case of $In_xZn_yP/$In—Ga—P/GaP and $In_xZn_yP/ZnSe_zS_{1-z}$ QDs the PL decreased after exposure. $In_xZn_yP/$In—Ga—P/GaP/$ZnSe_zS_{1-z}$ QDs showed prolonged stability as the PL QY, after an initial small drop of about 5% in the first hour, retained a constant PL QY of 70% for 5 weeks. The experiment illustrates multishell QDs of $In_xZn_yP/$In—Ga—P/GaP/$ZnSe_zS_{1-z}$ may have excellent photostability.

Though the discussion herein refers to InP-based QDs, a promising material for lighting and display applications of QDs, the technique of alloying QD cores to match the lattice of subsequent shells may be applied to other material systems.

Any suitable shell material may be used in embodiments of the invention, including, for example, MgSe, ZnS, ZnSe, ZnTe, CdSe, CdS, GaP, GaN, GaAs, and GaSb.

Any suitable core material may be used in embodiments of the invention, including, for example, GaN, GaP, GaAs, GaSb, AlN, AlP, AlAs, AlSb, InN, InP, InAs, InSb, GaNP, GaNAs, GANSb, GaPAs, GaPSb, AlNP, AlNAs, ALNSb, AlPAs, AlPSb, InNP, InNAs, InNSb, InPAs, InPSb, GaAlNP, AlGaN, AlGaP, AlGaAs, AlGaSb, InGaN, InGaP, InGaAs, InGaSb, AlInN, AlInP, AlInAs, AlInSb, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and other combinations thereof.

The individual particles of the nanocrystal materials described herein may be any suitable shape including, for example, spheres, rods, sheets, triangles, etc. In some embodiments, the individual particles are spheres (quantum dots), which may luminesce more efficiently than other material.

The nanocrystal materials described herein may be tuned to emit different colors of light, for example by selecting the composition of the core material. In various embodiments, the nanocrystal materials may be tuned to emit red, amber, green, or blue light.

The nanocrystal materials described herein emit light with a full width half maximum (FWHM) of no more than 80 nm in some embodiments, no more than 70 nm in some embodiments, no more than 65 nm in some embodiments, no more than 60 nm, and at least 10 nm in some embodiments.

The nanocrystal materials described herein may be used to form giant-shell quantum dots, in some embodiments. In traditional core-shell structures, the outer semiconductor shell may provide a higher band-gap interface and may passivate the outer surface of the quantum dot core. When there is lattice mismatch between the core and the shell, the shell thickness is limited. For example, in a CdSe/ZnS quantum dot, increasing the ZnS shell thickness beyond a nominal 3 monolayers (QD diameter 7~10 nm) often results in reduced quantum efficiency, because the lattice mis-match between CdSe and ZnS prevents defect-free epitaxial growth of thicker ZnS layers. The core QD diameter would typically be 3~6 nm.

In giant shell QDs, the shell is much thicker. In a giant shell QD, the shell may be at least 5 monolayers thick in some embodiments, at least 10 monolayers thick in some embodiments, at least 15 monolayers thick in some embodiments, at least 20 monolayers thick in some embodiments, and no more than 500 monolayers thick in some embodiments. The final QD diameter may be 15~20 nm in some embodiments, at least 10 nm in some embodiments, at least 15 nm in some embodiments, at least 20 nm in some embodiments, and no more than 50 nm in some embodiments.

Giant shell QDs generally have greater optical absorption within the shell relative to the core, as compared to traditional QDs, since the shell consists of larger percentage of the bulk mass in a giant shell QD.

Lattice matching between the core and shell may improve the quantum efficiency (brightness) and stability of a giant shell QD. For example, a lattice mismatched shell material energetically favors returning to its bulk crystal lattice, as opposed to following the template from the core material. Hence, the lattice matching is perceived to be a key ingredient to allow for both large diameters and high QE.

Figure 8A:
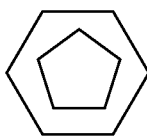
FIGS. 8A, 8B, and 8C illustrates core-shell, giant core-shell, and asymmetric core-shell quantum dots, respectively.
Figure 8B:
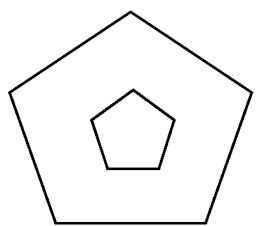
Figure 8C:
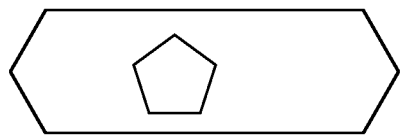

The nanocrystal materials described herein may be used in asymmetric QD structures (ie. Symmetric core+elongated rod-like shell). In such structures, during growth of the shell, a larger mass of shell material is grown only on the portion of the QD core. This may allow for reducing the overall stress on the layers as the lattice matching is not over the entire surface. FIG. 8(a) illustrates a core-shell QD, FIG. 8(b) illustrates a giant core-shell QD, and FIG. 8(c) illustrates an asymmetric core-shell QD.

In the discussion herein, the lattice mismatches may be calculated using a core lattice constant determined from XRD measurements (having an uncertainty in the range 0.01-0.001 Å) and a shell lattice constant taken from literature (Sadekar, H. K.; Ghule, A. V.; Sharma, R. J. Alloys Compd. 2011, 509 (18), 5525-5531) (for the given composition). The shell lattice constant in the nanosystems may differ from the bulk literature values.

In some embodiments, the lattice mismatch may be reduced from less than 1% to almost 0%. The lattice mismatch, defined as $[(a_{core}-a_{shell})/a_{shell}]*100\%$, may be no more than 1.7% in some embodiments, no more than 1.5% in some embodiments, no more than 1% in some embodiments, no more than 0.7% in some embodiments, no more than 0.5% in some embodiments, and 0% in some embodiments (lattice match). In the above equation, $a_{core}$ refers to the actual lattice constant in the as-grown core, and $a_{shell}$ refers to the actual lattice constant in the as-grown shell. Lattice engineering of the core allows for strain free epitaxial growth of functional shell materials, including ZnSe, GaP and ZnS. In some embodiments, photoluminescence quantum yields may be maximal, up to 60%, when the lattice constant of $In_xZn_yP$ cores matches that of a $ZnSe_zS_{1-z}$ shell.

Some benefits of embodiments of the invention may include (1) defect free core-shell structures over alloyed InZnP QD cores; (2) large "giant" QDs afforded by defect free shell layer over core of alloyed InZnP QD cores; (3) asymmetric QD structures (rod, tetrapod, wire, etc) using alloyed InZnP QD cores; (4) improved QE and stability from QD structures using alloyed InZnP QD cores; and (5) a simple one-pot method for the synthesis of zinc-blende $In_xZn_yP$ alloyed nanocrystals with tunable lattice parameters. Other benefits are contemplated and within the scope of the invention.

Though the examples and embodiments herein refer to replacing an atom in the lattice with an atom with a smaller ionic radius, in some embodiments, the lattice constant may be changed by replacing an atom with a larger ionic radius.

The luminescent materials described herein may absorb light of a first wavelength and emit light of a different, second wavelength, which may be a different color from the first wavelength. The luminescent materials may be combined with a light source such as a light emitting diode (LED), according to some embodiments.

Figure 4:
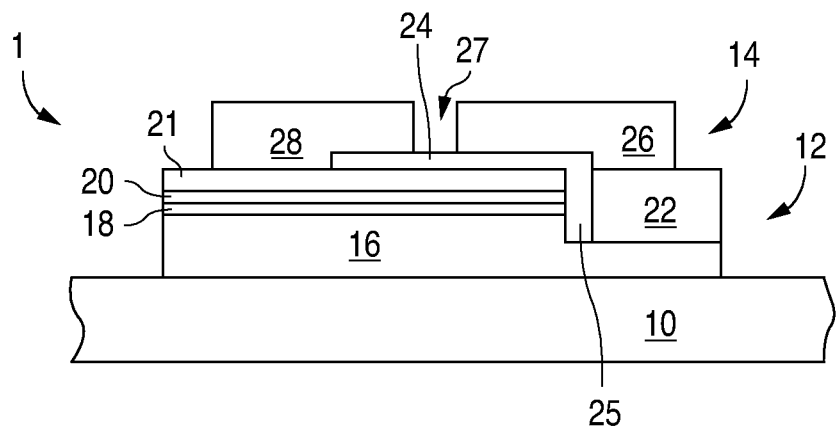
FIG. 4 is a cross sectional view of an LED.

FIG. 4 illustrates a III-nitride LED 1 that may be used with the above-described luminescent materials in embodiments of the present invention. Any suitable semiconductor light emitting device may be used and embodiments of the invention are not limited to the device illustrated in FIG. 4. The device of FIG. 4 is formed by growing a III-nitride semiconductor structure on a growth substrate 10 as is known in the art. The growth substrate is often sapphire but may be any suitable substrate such as, for example, SiC, Si, GaN, or a composite substrate. A surface of the growth substrate on which the III-nitride semiconductor structure is grown may be patterned, roughened, or textured before growth, which may improve light extraction from the device. A surface of the growth substrate opposite the growth surface (i.e. the surface through which a majority of light is extracted in a flip chip configuration) may be patterned, roughened or textured before or after growth, which may improve light extraction from the device.

The semiconductor structure includes a light emitting or active region sandwiched between n- and p-type regions. An n-type region 16 may be grown first and may include multiple layers of different compositions and dopant concentration including, for example, preparation layers such as buffer layers or nucleation layers, and/or layers designed to facilitate removal of the growth substrate, which may be n-type or not intentionally doped, and n- or even p-type device layers designed for particular optical, material, or electrical properties desirable for the light emitting region to efficiently emit light. A light emitting or active region 18 is grown over the n-type region. Examples of suitable light emitting regions include a single thick or thin light emitting layer, or a multiple quantum well light emitting region including multiple thin or thick light emitting layers separated by barrier layers. A p-type region 20 may then be grown over the light emitting region. Like the n-type region, the p-type region may include multiple layers of different composition, thickness, and dopant concentration, including layers that are not intentionally doped, or n-type layers.

After growth, a p-contact is formed on the surface of the p-type region. The p-contact 21 often includes multiple conductive layers such as a reflective metal and a guard metal which may prevent or reduce electromigration of the reflective metal. The reflective metal is often silver but any suitable material or materials may be used. After forming the p-contact 21, a portion of the p-contact 21, the p-type region 20, and the active region 18 is removed to expose a portion of the n-type region 16 on which an n-contact 22 is formed. The n- and p-contacts 22 and 21 are electrically isolated from each other by a gap 25 which may be filled with a dielectric such as an oxide of silicon or any other suitable material. Multiple n-contact vias may be formed; the n- and p-contacts 22 and 21 are not limited to the arrangement illustrated in FIG. 4. The n- and p-contacts may be redistributed to form bond pads with a dielectric/metal stack, as is known in the art.

In order to form electrical connections to the LED 1, one or more interconnects 26 and 28 are formed on or electrically connected to the n- and p-contacts 22 and 21. Interconnect 26 is electrically connected to n-contact 22. Interconnect 28 is electrically connected to p-contact 21. Interconnects 26 and 28 are electrically isolated from the n- and p-contacts 22 and 21 and from each other by dielectric layer 24 and gap 27. Interconnects 26 and 28 may be, for example, solder, stud bumps, gold layers, or any other suitable structure.

The substrate 10 may be thinned or entirely removed. In some embodiments, the surface of substrate 10 exposed by thinning is patterned, textured, or roughened to improve light extraction.

Any suitable light emitting device may be used in light sources according to embodiments of the invention. The invention is not limited to the particular LED illustrated in FIG. 4. The light source, such as, for example, the LED illustrated in FIG. 4, is illustrated in the following figures by block 1.

Figure 5:
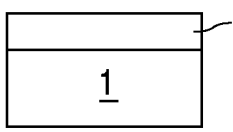
FIG. 5 is a cross sectional view of a device with a wavelength converting structure in direct contact with an LED.
Figure 6:
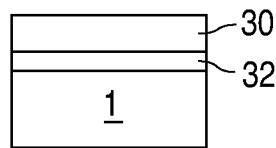
FIG. 6 is a cross sectional view of a device with a wavelength converting structure in close proximity to an LED.
Figure 7:
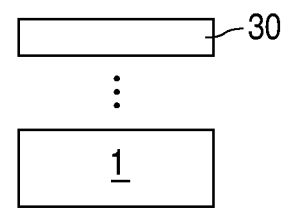
FIG. 7 is a cross sectional view of a device with a wavelength converting structure spaced apart from an LED.

FIGS. 5, 6, and 7 illustrate devices that combine an LED 1 and a wavelength converting structure 30. The wavelength converting structure 30 may include a luminescent material such as nanocrystal luminescent materials according to the embodiments and examples described herein.

The wavelength converting structure may be, for example, one or more luminescent materials disposed in transparent material such as silicone or glass that is rolled, cast, or otherwise formed into a sheet, then singulated into individual wavelength converting structures; one or more luminescent materials that are disposed in a transparent material such as silicone that is formed into a flexible sheet, which may be laminated or otherwise disposed in the path of light from an LED 1, one or more luminescent materials that are mixed with a transparent material such as silicone and dispensed, screen printed, stenciled, molded, or otherwise disposed over LED 1, or on a transparent plate that may be disposed in the path of light from an LED 1; and luminescent materials that are coated on LED 1 or another structure by electrophoretic, vapor, or any other suitable type of deposition.

In FIG. 5, the wavelength converting structure 30 is directly connected to the LED 1. For example, the wavelength converting structure may be directly connected to the substrate 10 illustrated in FIG. 4, or to the semiconductor structure, if the substrate 10 is removed.

In FIG. 6, the wavelength converting structure 30 is disposed in close proximity to LED 1, but not directly connected to the LED 1. For example, the wavelength converting structure 30 may be separated from LED 1 by an adhesive layer 32, a small air gap, a transparent plate that supports the wavelength converting structure 30, or any other suitable structure. The spacing between LED 1 and the wavelength converting structure 30 may be, for example, less than 500 μm in some embodiments.

In FIG. 7, the wavelength converting structure 30 is spaced apart from LED 1. The spacing between LED 1 and the wavelength converting structure 30 may be, for example, on the order of millimeters in some embodiments. Such a device may be referred to as a "remote phosphor" device. Remote phosphor arrangements may be used, for example, in backlights for displays.

The wavelength converting structure 30 may be square, rectangular, polygonal, hexagonal, circular, or any other suitable shape. The wavelength converting structure may be the same size as LED 1, larger than LED 1, or smaller than LED 1.

Multiple wavelength converting materials and multiple wavelength converting structures can be used in a single device. For example, multiple wavelength converting structures as described above may be used in a single device, and/or the wavelength converting structures described above may be combined with other wavelength converting structures such as, for example, luminescent ceramics, powder phosphors, or any other suitable structure.

In addition to luminescent materials described herein, a device may also include other wavelength converting materials such as, for example, conventional phosphors, organic phosphors, dyes, organic semiconductors, II-VI or III-V semiconductors, Si, II-VI, or III-V semiconductor quantum dots or nanocrystals, polymers, or other materials that luminesce.

The wavelength converting materials absorb light emitted by the LED and emit light of one or more different wavelengths. Unconverted light emitted by the LED is often part of the final spectrum of light extracted from the structure, though it need not be. Examples of common combinations include a blue-emitting LED combined with a yellow-emitting wavelength converting material, a blue-emitting LED combined with green- and red-emitting wavelength converting materials, a UV-emitting LED combined with blue- and yellow-emitting wavelength converting materials, and a UV-emitting LED combined with blue-, green-, and red-emitting wavelength converting materials. Wavelength converting materials emitting other colors of light may be added to tailor the spectrum of light extracted from the structure.

Multiple wavelength converting materials may be mixed together or formed as separate structures.

In some embodiments, other materials may be added to the wavelength converting structure or the device, such as, for example, materials that improve optical performance, materials that encourage scattering, and/or materials that improve thermal performance.

EXAMPLES

In an example of typical synthesis, tris(trimethylsilyl) phosphine ($P(TMS)_3$) was injected into a solution of indium acetate ($In(OAc)_3$), zinc acetate ($Zn(OAc)_2$) and palmitic acid (In:Zn:PA=1:0.5:3) at 300° C. Indium acetate (0.12 mmol), zinc acetate (0.06 mmol) and palmitic acid (0.36 mmol) were mixed in octadecene (ODE), and kept under vacuum for 2 h at 130° C. In a $N_2$ purged glove box a solution of $P(TMS)_3$ (In:P=2:1) in 1 mL of ODE was prepared and loaded into a syringe. After degassing, the temperature was raised to 300° C. The phosphorus precursor was then rapidly injected into the reaction mixture and the temperature was reduced and maintained at 270° C. for 2 h. While keeping the amount of indium fixed, the Zn/In precursor ratio was varied between 0 and 5, or between 0 and 10. The resulting $In_xZn_yP$ NCs were washed three times by addition of ethanol and acetone to induce precipitation, followed by dispersion in toluene. As an additional washing step the organic ligands were stripped and replaced with $S^{2-}$ ions through the addition of $(NH_4)_2S$, which allows the removal of unreacted species.

Preparation of $In_xZn_yP$ QDs, with different Zn/In ratios (0, 0.5, 3) in the range of 0<Zn/In<10.

Example 1, InP core synthesis (y/x=0). In a three-neck flask 35 mg $In(OAc)_3$ (0.12 mmol), and 91 mg palmitic acid (0.36 mmol) were mixed in 8 mL 1-octadecene. The solution was degassed under vacuum for an hour at 100° C. After heating up the solution to 300° C. under nitrogen flow, 17 μL (P(TMS)$_3$) (0.06 mmol; 15 mg) in 1 mL ODE was rapidly injected. The temperature was then lowered to 270° C. and held for 2 h. The InP NCs were washed three times by dispersion in toluene followed by precipitation by addition of a mixture ethanol:acetone (1:3), and stored in toluene or hexane in a N$_2$ filled vial in the glovebox. The obtained nanocrystal (QD) has a UV first absorption maximum around 540 nm, and lattice constant of 5.928 Å.

Example 2, In$_x$Zn$_y$P core synthesis (y/x=0.5). In a three-neck flask 35 mg In(OAc)$_3$ (0.12 mmol), 11 mg Zn(OAc)$_2$ (0.06 mmol) and 91 mg palmitic acid (0.36 mmol) were mixed in 8 mL 1-octadecene. The solution was degassed under vacuum for an hour at 100° C. After heating up the solution to 300° C. under nitrogen flow, 17 μL (P(TMS)$_3$) (0.06 mmol; 15 mg) in 1 mL ODE was rapidly injected. The temperature was then lowered to 270° C. and held for 2 h. The In$_x$Zn$_y$P NCs were washed three times by dispersion in toluene followed by precipitation by addition of a mixture ethanol:acetone (1:3), and stored in toluene or hexane in a N$_2$ filled vial in the glovebox. The obtained nanocrystal (QD) has a UV first absorption maximum around 503 nm, and a lattice constant of 5.863 Å.

Example 3, In$_x$Zn$_y$P core synthesis (y/x=2.8). In a three-neck flask 35 mg In(OAc)$_3$ (0.12 mmol), 66 mg Zn(OAc)$_2$ (0.36 mmol) and 91 mg palmitic acid (0.36 mmol) were mixed in 8 mL 1-octadecene. The solution was degassed under vacuum for an hour at 100° C. After heating up the solution to 300° C. under nitrogen flow, 17 μL (P(TMS)$_3$) (0.06 mmol; 15 mg) in 1 mL ODE was rapidly injected. The temperature was then lowered to 270° C. and held for 2 h. The In$_x$Zn$_y$P NCs were washed three times by dispersion in toluene followed by precipitation by addition of a mixture ethanol:acetone (1:3), and stored in toluene or hexane in a N$_2$ filled vial in the glovebox. The obtained nanocrystal (QD) has a UV first absorption maximum around 517 nm, and a lattice constant of 5.497 Å.

The amount of zinc precursors was varied between 0 mg (for Zn/In=0) and 220 mg (for Zn/In=10), while the In(OAc)$_3$ and P(TMS)$_3$ were kept constant.

In the examples below, different cores were used for the fabrication of a core shell structure. The cores match shells with different composition: ZnSe$_{0.51}$S$_{0.49}$ shells in case of In$_x$Zn$_y$P QD cores (y/x=2.8), ZnSe$_{0.2}$S$_{0.8}$ shells in case of In$_x$Zn$_y$P QD cores (y/x=3.6), and ZnSe$_{0.8}$S$_{0.2}$ shells in case of In$_x$Zn$_y$P QD cores (y/x=2). The shell composition was varied to demonstrate that the highest values of QY was obtained when the core and the shell match.

Preparation of In$_x$Zn$_y$P QDs (y/x=2.8) core with ZnSe$_z$S$_{z-1}$ shell.

Example 4, preparation of In$_x$Zn$_y$P QDs (y/x=2.8) core with lattice constant 5.497 Å and a ZnS shell with lattice constant a: 5.407 Å. For a synthesis with z=0, 0.325 g of Zn stearate in 1.5 mL of ODE was added into a three neck flask containing 2 ml of as synthesized In$_x$Zn$_y$P core at room temperature. The temperature was then set to 300° C. with a rate of 10° C./min. When the temperature was about 90° C., 0.5 mL of 4M solution of TOP-S was injected into the reaction mixture. The reaction was kept at 300° C. for 20 min, and subsequently quenched by lowering the temperature. The product was purified by dispersion in chloroform (2 mL) followed by precipitation by addition of a mixture of ethanol:acetone (1:4). The obtained nanocrystal (QD) has a maximum PL emission at 518 nm and QY: 41.4%.

Example 5, preparation of In$_x$Zn$_y$P QDs (y/x=2.8) core with lattice constant 5.497 Å and a ZnSe$_{0.6}$S$_{0.4}$ shell with lattice constant a: 5.535 Å. For a synthesis with z=0.6, 0.325 g of Zn stearate in 1.5 mL of ODE was added into a three neck flask containing 2 ml of as synthesized In$_x$Zn$_y$P core at room temperature. The temperature was then set to 300° C. with a rate of 10° C./min. When the temperature was about 90° C., 0.3 mL of 4M solution of TOP-Se and 0.2 mL of a 4 ML solution of TOP-S were simultaneously injected into the reaction mixture. The reaction was kept at 300° C. for 20 min, and subsequently quenched by lowering the temperature. The product was purified by dispersion in chloroform (2 mL) followed by precipitation by addition of a mixture of ethanol:acetone (1:4). The obtained nanocrystal (QD) has a maximum PL emission at 547 nm and QY: 49.2%.

Example 6, preparation of In$_x$Zn$_y$P QDs (y/x=2.8) core with lattice constant 5.497 Å and a ZnSe$_{0.4}$S$_{0.6}$ shell with lattice constant a: 5.464 Å. For a synthesis with z=0.4, 0.325 g of Zn stearate in 1.5 mL of ODE was added into a three neck flask containing 2 ml of as synthesized In$_x$Zn$_y$P core at room temperature. The temperature was then set to 300° C. with a rate of 10° C./min. When the temperature was about 90° C., 0.20 mL of 4M solution of TOP-Se and 0.30 mL of a 4 ML solution of TOP-S were simultaneously injected into the reaction mixture. The reaction was kept at 300° C. for 20 min, and subsequently quenched by lowering the temperature. The product was purified by dispersion in chloroform (2 mL) followed by precipitation by addition of a mixture of ethanol:acetone (1:4). The obtained nanocrystal (QD) has a maximum PL emission at 551 nm and QY: 59.2%.

Example 7, preparation of In$_x$Zn$_y$P QDs (y/x=2.8) core with lattice constant 5.497 Å and a ZnSe$_{0.51}$S$_{0.49}$ shell with lattice constant a: 5.4971 Å. For a synthesis with z=0.6, 0.325 g of Zn stearate in 1.5 mL of ODE was added into a three neck flask containing 2 ml of as synthesized In$_x$Zn$_y$P core at room temperature. The temperature was then set to 300° C. with a rate of 10° C./min. When the temperature was about 90° C., 0.255 mL of 4M solution of TOP-Se and 0.245 mL of a 4 ML solution of TOP-S were simultaneously injected into the reaction mixture. The reaction was kept at 300° C. for 20 min, and subsequently quenched by lowering the temperature. The product was purified by dispersion in chloroform (2 mL) followed by precipitation by addition of a mixture of ethanol:acetone (1:4). The obtained nanocrystal (QD) has a maximum PL emission at 552 nm and QY: 60%.

Preparation of In$_x$Zn$_y$P QDs (y/x=3.6) core with ZnSe$_z$S$_{1-z}$ shell.

Example 8, preparation of In$_x$Zn$_y$P QDs (y/x=3.6) core with lattice constant 5.449 Å and a ZnS shell with lattice constant a: 5.407 Å. For a synthesis with z=0, 0.325 g of Zn stearate in 1.5 mL of ODE was added into a three neck flask containing 2 ml of as synthesized In$_x$Zn$_y$P core at room temperature. The temperature was then set to 300° C. with a rate of 10° C./min. When the temperature was about 90° C., 0.5 mL of 4M solution of TOP-S was injected into the reaction mixture. The reaction was kept at 300° C. for 20 min, and subsequently quenched by lowering the temperature. The product was purified by dispersion in chloroform (2 mL) followed by precipitation by addition of a mixture of ethanol:acetone (1:4). The obtained nanocrystal (QD) has a maximum PL emission at 518 nm and QY: 25.4%.

Example 9, preparation of In$_x$Zn$_y$P QDs (y/x=3.6) core with lattice constant a: 5.449 Å and a ZnSe$_{0.2}$S$_{0.8}$ shell with lattice constant a: 5.435 Å. For a synthesis with z=0.2, 0.325 g of Zn stearate in 1.5 mL of ODE was added into a three neck flask containing 2 ml of as synthesized In$_x$Zn$_y$P core at room temperature. The temperature was then set to 300° C.

with a rate of 10° C./min. When the temperature was about 90° C., 0.10 mL of 4M solution of TOP-Se and 0.40 mL of a 4 ML solution of TOP-S were simultaneously injected into the reaction mixture. The reaction was kept at 300° C. for 20 min, and subsequently quenched by lowering the temperature. The product was purified by dispersion in chloroform (2 mL) followed by precipitation by addition of a mixture of ethanol:acetone (1:4). The obtained nanocrystal (QD) has a maximum PL emission at 547 nm and QY: 45.2%.

Example 10, preparation of $In_xZn_yP$ QDs (y/x=3.6) core with lattice constant 5.449 Å and a $ZnSe_{0.4}S_{0.6}$ shell with lattice constant a: 5.464 Å. For a synthesis with z=0.4, 0.325 g of Zn stearate in 1.5 mL of ODE was added into a three neck flask containing 2 ml of as synthesized $In_xZn_yP$ core at room temperature. The temperature was then set to 300° C. with a rate of 10° C./min. When the temperature was about 90° C., 0.20 mL of 4M solution of TOP-Se and 0.30 mL of a 4 ML solution of TOP-S were simultaneously injected into the reaction mixture. The reaction was kept at 300° C. for 20 min, and subsequently quenched by lowering the temperature. The product was purified by dispersion in chloroform (2 mL) followed by precipitation by addition of a mixture of ethanol:acetone (1:4). The obtained nanocrystal (QD) has a maximum PL emission at 551 nm and QY: 36.2%.

Example 11, preparation of $In_xZn_yP$ QDs (y/x=3.6) core with lattice constant 5.449 Å and a $ZnSe_{0.8}S_{0.2}$ shell with lattice constant a: 5.572 Å. For a synthesis with z=0.6, 0.325 g of Zn stearate in 1.5 mL of ODE was added into a three neck flask containing 2 ml of as synthesized $In_xZn_yP$ core at room temperature. The temperature was then set to 300° C. with a rate of 10° C./min. When the temperature was about 90° C., 0.40 mL of 4M solution of TOP-Se and 0.10 mL of a 4 ML solution of TOP-S were simultaneously injected into the reaction mixture. The reaction was kept at 300° C. for 20 min, and subsequently quenched by lowering the temperature. The product was purified by dispersion in chloroform (2 mL) followed by precipitation by addition of a mixture of ethanol:acetone (1:4). The obtained nanocrystal (QD) has a maximum PL emission at 552 nm and QY: 19%.

Example 12, preparation of $In_xZn_yP$ QDs (y/x=3.6) core with lattice constant 5.449 Å and a ZnSe shell with lattice constant a: 5.670 Å. For a synthesis with z=0.6, 0.325 g of Zn stearate in 1.5 mL of ODE was added into a three neck flask containing 2 ml of as synthesized $In_xZn_yP$ core at room temperature. The temperature was then set to 300° C. with a rate of 10° C./min. When the temperature was about 90° C., 0.5 mL of 4 M solution of TOP-Se was injected into the reaction mixture. The reaction was kept at 300° C. for 20 min, and subsequently quenched by lowering the temperature. The product was purified by dispersion in chloroform (2 mL) followed by precipitation by addition of a mixture of ethanol:acetone (1:4). The obtained nanocrystal (QD) has a maximum PL emission at 552 nm and QY: 18%.

Preparation of $In_xZn_yP$ QDs (y/x=2) core with $ZnSe_zS_{1-z}$ shell.

Example 13, preparation of $In_xZn_yP$ QDs (y/x=2) core with lattice constant 5.601 Å and a ZnS shell with lattice constant a: 5.407 Å. For a synthesis with z=0, 0.325 g of Zn stearate in 1.5 mL of ODE was added into a three next flask containing 2 ml of as synthesized $In_xZn_yP$ core at room temperature. The temperature was then set to 300° C. with a rate of 10° C./min. When the temperature was about 90° C., 0.5 mL of 4M solution of TOP-S was injected into the reaction mixture. The reaction was kept at 300° C. for 20 min, and subsequently quenched by lowering the temperature. The product was purified by dispersion in chloroform (2 mL) followed by precipitation by addition of a mixture of ethanol:acetone (1:4). The obtained nanocrystal (QD) has a maximum PL emission at 518 nm and QY: 20.5%.

Example 14, preparation of $In_xZn_yP$ QDs (y/x=2) core with lattice constant 5.601 Å and a $ZnSe_{0.4}S_{0.6}$ shell with lattice constant a: 5.464 Å. For a synthesis with z=0.6, 0.325 g of Zn stearate in 1.5 mL of ODE was added into a three neck flask containing 2 ml of as synthesized $In_xZn_yP$ core at room temperature. The temperature was then set to 300° C. with a rate of 10° C./min. When the temperature was about 90° C., 0.2 mL of 4M solution of TOP-Se and 0.3 mL of a 4 ML solution of TOP-S were simultaneously injected into the reaction mixture. The reaction was kept at 300° C. for 20 min, and subsequently quenched by lowering the temperature. The product was purified by dispersion in chloroform (2 mL) followed by precipitation by addition of a mixture of ethanol:acetone (1:4). The obtained nanocrystal (QD) has a maximum PL emission at 552 nm and QY: 26.4%.

Example 15, preparation of $In_xZn_yP$ QDs (y/x=2) core with lattice constant 5.601 Å and a $ZnSe_{0.8}S_{0.2}$ shell with lattice constant a: 5.572 Å. For a synthesis with z=0.6, 0.325 g of Zn stearate in 1.5 mL of ODE was added into a three neck flask containing 2 ml of as synthesized $In_xZn_yP$ core at room temperature. The temperature was then set to 300° C. with a rate of 10° C./min. When the temperature was about 90° C., 0.4 mL of 4M solution of TOP-Se and 0.1 mL of a 4 ML solution of TOP-S were simultaneously injected into the reaction mixture. The reaction was kept at 300° C. for 20 min, and subsequently quenched by lowering the temperature. The product was purified by dispersion in chloroform (2 mL) followed by precipitation by addition of a mixture of ethanol:acetone (1:4). The obtained nanocrystal (QD) has a maximum PL emission at 552 nm and QY: 41%.

Example 16, preparation of $In_xZn_yP$ QDs (y/x=2) core with lattice constant 5.601 Å and a ZnSe shell with lattice constant a: 5.670 Å. For a synthesis with z=0, 0.325 g of Zn stearate in 1.5 mL of ODE was added into a three next flask containing 2 ml of as synthesized $In_xZn_yP$ core at room temperature. The temperature was then set to 300° C. with a rate of 10° C./min. When the temperature was about 90° C., 0.5 mL of 4 M solution of TOP-Se was injected into the reaction mixture. The reaction was kept at 300° C. for 20 min, and subsequently quenched by lowering the temperature. The product was purified by dispersion in chloroform (2 mL) followed by precipitation by addition of a mixture of ethanol:acetone (1:4). The obtained nanocrystal (QD) has a maximum PL emission at 518 nm and QY: 34%.

Preparation of $In_xZn_yP$ QDs (y/x=2.8) core with $ZnSe_zS_{z-1}$ Giant-shell.

Example 17, preparation of $In_xZn_yP$ QDs (y/x=2.8) core with lattice constant 5.497 Å and a $ZnSe_{0.51}S_{0.49}$ giant shell with lattice constant a: 5.4971 Å. For a synthesis with z=0.6, 0.325 g of Zn stearate in 1.5 mL of ODE was added into a three neck flask containing 2 ml of as synthesized $In_xZn_yP$ core at room temperature. The temperature was then set to 300° C. with a rate of 10° C./min. When the temperature was about 90° C., 0.255 mL of 4M solution of TOP-Se and 0.245 mL of a 4 ML solution of TOP-S were simultaneously injected into the reaction mixture. The shell was annealed at 300° C. for 20 min. The temperature was then lowered at 100° C. and the same procedure was repeated for the additional shells layers. The amount of Zn precursor for the shell addition cycles 2 and 3 were as follows: 0.75 g and 1.5 g in 5 mL of ODE, respectively. In case of the Se and S precursor, the amounts were 0.50 mL (TOP-Se) and 0.49 mL (TOP-S) for the second cycle, and 1.02 mL (TOP-Se) and 0.98 mL (TOP-S) for the third cycle. The product was purified by dispersion in chloroform (5 mL) followed by precipitation by addition of a mixture of ethanol:acetone (1:4).

Example 18, red emitting $In_xZn_yP$ core synthesis (y/x=1). Red-emitting, giant shell QDs are formed as follows: for growth of the synthesized InP cores a stock solution may be made containing 292 mg (1 mmol) of $In(OAc)_3$, 184 mg (1 mmol) of $Zn(OAc)_2$ and 769 mg (3 mmol) of PA in 10 mL of ODE in a three-neck round-bottom flask. The mixture may be put under vacuum for 2 hours at 130° C. After two hours the mixture may be put under dried nitrogen gas and heated to 250° C. to dissolve the salts and to form the palmitate complex. After dissolution, the solution may be cooled. The $P(TMS)_3$ precursor may be made by diluting (145 µL (0.5 mmol) $P(TMS)_3P$ in 10 mL of ODE in the glovebox. After the synthesis of the $In_xZn_yP$ cores, the temperature of the core solution may be lowered to 250° C. 1 mL of the In—Zn palmitate stock solution may be injected dropwise into the core solution in 6 minutes. After 10 minutes, 1 mL of the $P(TMS)_3$ precursor solution may be injected dropwise in the $In_xZn_yP$ core solution over a time span of 40 minutes. The same procedure may be followed several time until the particles reached the desirable size. The obtained nanocrystal (QD) may have a UV first absorption maximum around 540 nm, and lattice constant of 5.576 Å.

Example 19, Synthesis with intermediate Ga-containing layer. InxZnyP QDs were synthesized by any suitable method, such as: 35 mg of $In(OAc)3$ (0.12 mmol), a desired amount of $Zn(OAc)_2$ and 91 mg of palmitic acid (0.36 mmol) were mixed together with 8 mL of 1-octadecene in a three-neck flask. The solution was degassed under vacuum for 1 hour at 100° C. After heating up the reaction mixture to 300° C. under nitrogen flow, 17 µL of $(P(TMS)_3)$ (0.06 mmol; 15 mg) in 1 mL of ODE were rapidly injected into the flask. The temperature was then lowered to 270° C. and the NCs were allowed to grow for 2 h. This "hot" crude reaction solution was immediately used for the cation exchange reactions or for the synthesis of red emitting QDs. Alternatively, to collect the $In_xZn_yP$ QDs, the reaction flask was rapidly cooled to room temperature and the NCs were washed three times by dispersion in toluene followed by precipitation by addition of a mixture ethanol:acetone (1:3), and eventually stored in toluene (or hexane) in a $N_2$ filled glovebox. The amount of zinc precursor was varied from 0 mg (for Zn/In=0) to 36 mg (for Zn/In=1.5), while the amounts of $In(OAc)_3$ and $P(TMS)_3$ were kept constant.

Preparation of the In—Zn palmitate (In:Zn=1:1) and $P(TMS)_3$ precursors: A In—Zn palmitate stock solution was prepared by mixing 292 mg (1 mmol) of $In(OAc)_3$, 184 mg (1 mmol) of $Zn(OAc)_2$ and 769 mg (3 mmol) of PA in 10 mL of ODE in a three-neck round-bottom flask. The mixture was degassed under vacuum at 130° C. for two hours and then heated to 250° C. under $N_2$ in order to form the In—Zn palmitate complexes. After complete dissolution of metal precursors, the solution was cooled to room temperature and stored in a $N_2$ filled glove box. A $P(TMS)_3$ precursor solution was prepared by diluting 145 µL (0.5 mmol) of $P(TMS)3P$ in 10 mL of ODE.

Growth of $In_xZn_yP$ cores: In order to further increase the size of as-synthesized $In_xZn_yP$ QDs, a multiple injection route was adopted. The temperature of the crude "hot" reaction mixture was lowered to 250° C. and 1 mL of the In—Zn palmitate stock solution was injected dropwise into the flask in 6 minutes. After 10 minutes, 1 mL of the $P(TMS)_3$ precursor solution was injected dropwise in the reaction flask over a time span of 40 minutes. The same procedure was followed several time till the particles reached the desirable size.

Cation exchange reaction between $Zn^{2+}$ and $Ga^{3+}$: A 0.2 M gallium precursor solution was prepared by dissolving $GaCl_3$ (3 mmol, 528 mg) in oleic acid (12 mmol, 3.39 g) and 20 mL ODE at 140° C. for 1 h. The temperature of the crude "hot" reaction mixture was lowered to 200° C. and 230 µL of Gallium precursor solution (containing 0.03 mmol of $Ga^{3+}$) were added dropwise. The reaction was kept for 1 hour after which other 230 µL of Gallium precursor solution (containing 0.03 mmol of $Ga^{3+}$) were added. Subsequent injections of Ga precursor solution were performed following the same procedure for a total of 0.15 mmol of $Ga(OA)_3$ added.

Synthesis of $In_xZn_yP/GaP$ core/shell QDs: The temperature of the crude "hot" reaction mixture was lowered to 200° C. and 230 µL of Gallium precursor solution (containing 0.03 mmol of $Ga^{3+}$) were added dropwise. The temperature was kept at 200° C. for 1 h. This was repeated 3 times for a total amount of 0.09 mmol of gallium added. Subsequently, 0.03 mmol of $P(TMS)_3$ diluted in 1 mL of ODE were added at 150° C. and reacted at 200° C. Subsequent injection of Ga and P precursor were performed following the same procedure.

Synthesis of $In_xZn_yP/GaP/ZnSe_zS_{1-z}$ core/shell/shell QDs: The selenium and sulphur precursor solutions, used for the $ZnSe_zS_{1-z}$ shell growth, were prepared as follow: in a reaction flask a 1M TOP-Se (or S) was prepared by dissolving 4 mmol of Se (or S) powder in 4 mL of TOP. In a typical synthesis, 0.325 g of Zn stearate in 1.5 mL of ODE, were added into a three next flask containing 2 ml of as synthesized $In_xZn_yP/GaP$ QDs at room temperature. At this point the temperature of the crude "hot" reaction mixture was set to 300° C. with a heating rate of 10° C./min. When the temperature reached 90° C., a total of 0.5 mL of the anions stock solution (Se-TOP+S-TOP) were added. The $ZnSe_zS_{1-z}$ shell composition was changed by varying the Se-TOP and S-TOP precursors amounts: for example in case of z=0, 0.5 mL of 1M TOP-S was added, while in case of z=0.5, 0.25 mL of 1M TOP-Se and 0.25 mL of 1M TOP-S were added. The reaction was kept at 300° C. for 20 min, and subsequently quenched by cooling the flask to room temperature. The resulting QDs were purified by dispersion in chloroform (2 mL) followed by precipitation by addition of a mixture of ethanol:acetone (1:4). The obtained QDs were stored in toluene in a $N_2$ filled vial in the glovebox.

Ligand exchange: A colloidal dispersion of washed NCs with organic ligands was prepared in nonpolar solvents like toluene, while the solution of inorganic ligands was prepared in polar formamide (FA) immiscible with toluene. The exchange of original organic ligands with $S^{2-}$ inorganic species was carried out in a $N_2$ glove box. 20 µl of $(NH_4)_2S$ solution was added to 1 mL of formamide (FA) and mixed with 1 ml of a QDs dispersion in toluene. The biphasic mixture was sonicated for 15 minutes in a sonic bath at 60° C., leading to a complete phase transfer of the NCs from toluene to the FA phase. The phase transfer can be easily monitored by the color change of toluene (red to colorless) and FA (colorless to red) phases. The FA phase was separated and acetone was added as non-solvent to precipitate the particles. To remove the residual organic ligands a further washing step with toluene was applied. This was repeated twice. Finally, the QDs were precipitated a last time by adding acetone as a non-solvent and re-dispersed in dimethylformamide (DMF) for further analysis and stored in a $N_2$ filled vial in the glovebox.

The numerical values in the examples described herein may form the end points of ranges for the given value, in some embodiments.

FIG. 9(a) illustrates normalized absorption and normalized PL spectra of $In_xZn_yP$ QDs with different $Zn^{2+}$ concentration. FIG. 9(b) is a plot of the $\lambda,max$ (nm) for the absorption and PL emission wavelengths as function of the Zn/In molar ratio obtained by ICP(OES) analysis. FIG. 9(c) is a plot of the PL QY (%) of $In_xZn_yP$ QDs as function of the Zn/In molar ratio obtained by ICP(OES) analysis.

FIG. 10 is a plot of absorption (left) and PL emission (right) of $In_xZn_yP$ core with Zn/In:2.8 and $In_xZn_yP/ZnSe_{0.51}S_{0.49}$ core-shell.

Having described the invention in detail, those skilled in the art will appreciate that, given the present disclosure, modifications may be made to the invention without departing from the spirit of the inventive concept described herein. Therefore, it is not intended that the scope of the invention be limited to the specific embodiments illustrated and described.

The invention claimed is:

1. A luminescent structure comprising:
   an $In_xZn_yP$ core, wherein $0 \leq y/x < 100$, and wherein the $In_xZn_yP$ core comprises an alloy including both In and Zn; and
   a shell disposed on a surface of the core, wherein a difference between a lattice constant of the shell and a lattice constant of the $In_xZn_yP$ core is less than 1.7% relative to the lattice constant of the shell.

2. The luminescent structure of claim 1 wherein $2 \leq y/x \leq 10$.

3. The luminescent structure of claim 1 further comprising an intermediate layer disposed between the shell and the $In_xZn_yP$ core, wherein the intermediate layer comprises Ga.

4. The luminescent structure of claim 1 wherein the shell is lattice-matched to the $In_xZn_yP$ core.

5. The luminescent structure of claim 1 wherein the shell comprises $ZnSe_zS_{1-z}$ wherein $z=0-1$.

6. The luminescent structure of claim 5 wherein the shell further comprises GaP.

7. The luminescent structure of claim 1 wherein the shell comprises GaP.

8. The luminescent structure of claim 1 wherein InP and ZnP form an alloy.

9. The luminescent structure of claim 1 wherein the $In_xZn_yP$ core comprises $Zn^{2+}$ incorporated into the crystal lattice of an InP quantum dot.

10. The luminescent structure of claim 1 wherein the $In_xZn_yP$ core is zinc blende.

11. The luminescent structure of claim 1 wherein y and x are not both equal to 1.

12. The luminescent structure of claim 1 wherein the $In_xZn_yP$ core consists of an alloy consisting of In, Zn, and P.

13. A structure comprising:
   a semiconductor light emitting device; and
   a nanocrystal disposed in a path of light emitted by the light emitting device, the nanocrystal comprising:
   an InZnP core consisting of an InZnP alloy; and
   a shell disposed on a surface of the core, wherein a difference between a lattice constant of the shell and a lattice constant of the core is less than 1.7% relative to the lattice constant of the shell.

14. A method of forming a luminescent quantum dot material, the method comprising:
   providing an $In_xZn_xP$ core, wherein $0 \leq y/x \leq 10$, and wherein the $In_xZn_yP$ core comprises an alloy including both In and Zn,
   surrounding the $In_xZn_yP$ core with a shell,
   wherein a difference between a lattice constant of the shell and a lattice constant of the $In_xZn_yP$ core is less than 1.7% relative to the lattice constant of the shell.

15. The method of claim 14 further comprising determining a lattice constant of the shell material composition.

16. The method of claim 14 wherein the core material comprises a group 12 material, a group 13 material, and a group 15 material.

17. The method of claim 16 wherein the group 12 material, the group 13 material, and the group 15 material form an alloy, such that the composition in the core material is substantially uniform through the core material.

18. The method of claim 14 further comprising tuning the lattice constant of the core by adjusting the concentration of precursor ratio of In/Zn during synthesis of the core.

* * * * *

UNITED STATES PATENT AND TRADEMARK OFFICE
CERTIFICATE OF CORRECTION

PATENT NO. : 10,508,236 B2  
APPLICATION NO. : 15/771315  
DATED : December 17, 2019  
INVENTOR(S) : Arjan-Jeroen Houtepen et al.

Page 1 of 1

It is certified that error appears in the above-identified patent and that said Letters Patent is hereby corrected as shown below:

(72) Inventors should read: Arjan-Jeroen Houtepen, The Haag (NL); Anne Weibe Hoekstra, Groningen (NL); Francesca Pietra, Reading (UK); Luca De Trizio, Bergamo (IT); Liberato Manna, Genova (IT)

Signed and Sealed this  
Third Day of March, 2020

Andrei Iancu  
*Director of the United States Patent and Trademark Office*